(12) United States Patent
Barnes

(10) Patent No.: US 6,480,050 B1
(45) Date of Patent: Nov. 12, 2002

(54) LEVEL SHIFTER WITH NO QUIESCENT DC CURRENT FLOW

(75) Inventor: William Bryan Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/658,048

(22) Filed: Sep. 8, 2000

(30) Foreign Application Priority Data

Sep. 9, 1999 (GB) .............................................. 9921367

(51) Int. Cl.[7] .................................................. H03L 5/00
(52) U.S. Cl. ......................... 327/333; 327/544; 326/81; 326/112
(58) Field of Search ................................. 327/333, 544, 327/563, 64, 65, 66, 199; 326/68, 80, 81, 112, 119, 121

(56) References Cited

U.S. PATENT DOCUMENTS

| 4,656,373 A | 4/1987 | Plus ........................... 326/81 |
| 5,006,738 A | * 4/1991 | Usuki et al. ................. 327/261 |
| 5,268,872 A | 12/1993 | Fujii et al. ............. 365/189.07 |
| 5,367,210 A | * 11/1994 | Lipp ............................ 326/83 |
| 5,666,068 A | 9/1997 | Ehmann ....................... 326/63 |
| 5,666,069 A | * 9/1997 | Gibbs ........................... 326/81 |
| 5,675,278 A | 10/1997 | Tanaka et al. .............. 327/333 |
| 5,781,051 A | * 7/1998 | Sandhu ....................... 327/198 |
| 6,177,816 B1 | * 1/2001 | Nagata ......................... 327/77 |

FOREIGN PATENT DOCUMENTS

EP  0 860 945  8/1998  .......... H03K/3/356

* cited by examiner

Primary Examiner—Timothy P. Callahan
Assistant Examiner—Terry L. Englund
(74) Attorney, Agent, or Firm—Wolf, Greenfield & Sacks, P.C.; James H. Morris

(57) ABSTRACT

A level shifter uses a current mirror as a current switch connected to the drains of two oppositely-driven FETs. A switch selectively connects the current mirror to its power supply so that no quiescent DC current flows.

22 Claims, 2 Drawing Sheets

LEVEL SHIFTER WITH NO QUIESCENT DC CURRENT FLOW

FIELD OF THE INVENTION

The present invention relates to a level shifter and more particularly to a CMOS level shifter.

BACKGROUND OF THE INVENTION

Level shifters are well known in logic circuitry. Some prior art level shifters require current to flow between the positive and negative supply rails in one or both of the logic states. This can be avoided by use of CMOS technology but there then may be a problem in that the relative current sourcing/sinking ability of the NMOS and PMOS transistors may have to be balanced. This is problematical because of process tolerances.

It is accordingly an object of the present invention to at least partially mitigate the above-mentioned difficulties.

SUMMARY OF THE INVENTION

According to a first aspect of the present invention there is provided a level shifter comprising a current mirror having a circuit node for receiving a current controlled by a control current applied at a control node thereof, said current mirror being selectively connected to a supply terminal via a supply switch, the level shifter further comprising a first switch connected to said control node for selectively applying said control current in response to an input logic signal at an input node, a second switch for selectively pulling down said circuit node in response to said input logic signal and connecting circuitry connecting said circuit node to a control terminal of said supply switch.

Preferably supply switch is implemented in PMOS technology and said first and second switches are NMOS transistors.

According to a second aspect of the invention there is provided a level shifter comprising a current mirror having a circuit node for receiving a current controlled by a control current applied at a control node thereof, said current mirror being selectively connected to a supply terminal via a PMOS supply switch, the level shifter further comprising a first NMOS switch connected to said control node for selectively applying said control current in response to an input logic signal at an input node, a second NMOS switch for selectively pulling down said circuit node in response to said input logic signal and connecting circuitry connecting said circuit node to a control terminal of said supply switch, wherein said current mirror comprises first and second transistors having common drain/source terminals, the first transistor having a source/drain terminal in common with its gate terminal as said control node, and the second transistor having a gate terminal in common with the gate terminal of the first transistor and a source/drain terminal as said circuit node.

Advantageously said current mirror comprises first and second p transistors having common drain/source terminals, the first transistor having a source/drain terminal in common with its gate terminal as said control node, and the second transistor having a gate terminal in common with the gate terminal of the first transistor and a source/drain terminal as said circuit node.

Preferably said connecting circuitry includes pull-up circuitry connected to said circuit node for maintaining said circuit node potential when said supply switch disconnects said current mirror from said supply node.

Preferably said pull-up circuitry comprises a p FET.

In one embodiment said connecting circuitry further comprises a direct connection between said circuit node and a control node of said supply switch.

Alternatively said connecting circuitry comprises a first inverter connected between said circuit node and a gate of said pull-up FET and a second inverter connected between said gate of said pull-up FET and the control terminal of said supply switch.

Preferably said level shifter further comprises an input inverter connected between a control node of said first switch and a control node of said second switch.

BRIEF DESCRIPTION OF THE DRAWINGS

Exemplary preferred embodiments of the invention will now be described with reference to the accompanying drawings in which.

DESCRIPTION OF THE PREFERRED EMBODIMENTS

Figure 1:
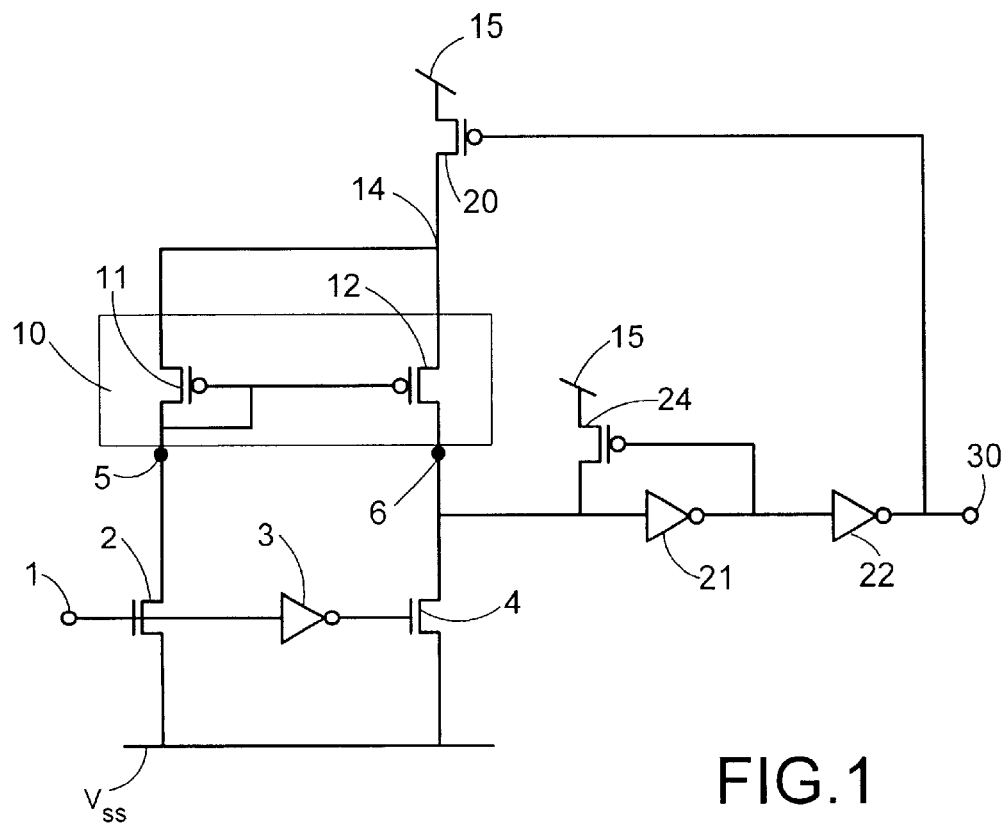
FIG. 1 shows a first embodiment of a level shifter in accordance with the present invention.

In the various figures like reference numerals refer to like parts.

Referring first to FIG. 1 a level shifter has an input terminal 1 connected to a first NMOS FET 2 and, via an inverter 3 to a second NMOS FET 4. The first and second FETs 2 and 4 have their sources connected to a negative supply VSS. The drain of the first FET 2 is connected to the control node 5 of a current mirror 10. The second FET 4 has its drain connected to a circuit node 6 of the current mirror 10. The current mirror 10 consists of two p FETS 11, 12, of which the first p FET 11 has a commoned gate and source/drain electrode connected as the control node 5. The second p FET 12 has a gate electrode connected to the gate electrode of the first p FET 11 and a drain/source terminal 6 as the circuit node. The two p FETs have a common source/drain terminal 14 which is selectively connected to a supply terminal 15, in use receiving the positive supply VDD, via a supply switch 20. The supply switch is a PMOS FET and, in this embodiment, the control electrode of the supply switch 20 is connected to the circuit node 6 via the series arrangement of two inverters 21, 22. The circuit node 6 is further connected to the positive supply terminal 15 via a pull-up transistor 24 whose control electrode is connected to the output of the first inverter 21. The pull-up transistor 24 is weak by comparison with the second switch 4.

In the present embodiment, the circuit output is derived from the output of the second inverter 22; it will of course be understood that it could be derived from a further inverter connected to the circuit node 6, if appropriate. The use of such an inverter to provide the output allows for separate optimization of the data propagation delays and the control for enabling the supply.

To consider the operation of the circuit it is necessary to consider the two transistors 20 and 24. If the circuit node 6 is at a high potential then the inverter 21 produces an output of low potential which is applied to the gate of the pull-up switch 24 to cause the circuit node 6 to remain at high potential.

The second inverter 22 produces a high potential at its output, thus effectively turning off the supply transistor 20.

If at this time a logic 1 is applied to the input terminal 1, the first switch 2 will be rendered conductive but the open circuit afforded by the supply switch 20 prevents any current from flowing from node 5. The result is that no change in the circuit occurs and no current flows between the supply terminal 15 and the reference node VSS.

If a logic 0 is applied to input terminal 1, then the first switch 2 will be turned off and the inverter 3 will produce a high output to the second switch 4. The second switch 4, because it is an NMOS FET will conduct and will pull-down the circuit node 6 to a low potential. The current mirror 10 is turned off-i.e.: the off-state of the first switch 2 does not apply current to the controlling p FET 11, and so no current flows through the controlled p FET 12. Pulling down the circuit node 6 causes the output of the first inverter 21 to go high, thus turning off the pull-up switch 24 and, via the second inverter 22, turning on the supply switch 20. Although the supply switch is turned on, there is no DC path because the current mirror 10 is off.

However, if at this time the input terminal is again supplied with a logic 1, then the first switch 2 will turn on thus sinking current from the control node 5 of the current mirror which in turn causes current to flow from the supply switch 20 through the second PMOS FET 12 of the current mirror causing the circuit node 6 to be pulled high. Because in this situation the second switch 4 is off, there is again no DC path present.

It will be seen therefore that the level shifter as described is to a certain extent bistable.

Figure 2:
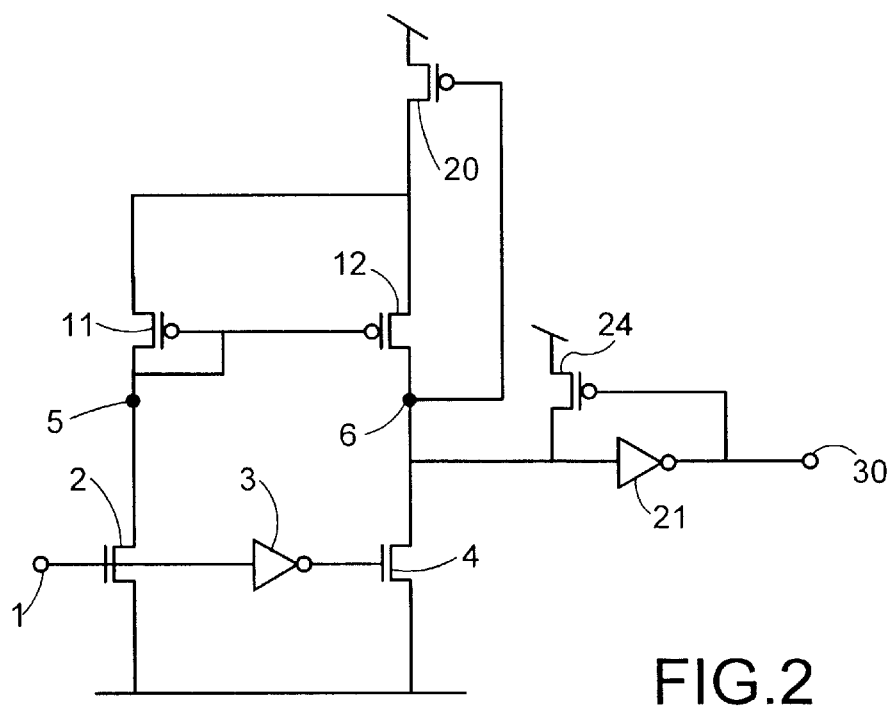
FIG. 2 shows a simplified level shifter in accordance with the present invention.

A simplified arrangement is shown in FIG. 2 in which the control gate of the supply switch 20 is connected directly to the circuit node 6.

A constraint on both of the embodiments described is that the current sourcing ability of the pull-up transistor is less than the pull-down ability of the second switch 4. There is no requirement to balance the drain/source currents of NMOS and PMOS FETs. As has been discussed above, there is no static current flow in either logic state.

It will be clear to those skilled in the art that the inverters 21 and 22 shown in FIG. 1 have a propagation delay. The particular circuit shown therefore operates successfully provided the time between input transitions to the input terminal 1 is greater than this propagation delay. If this is not the case, then other alternative circuits may be necessary to rapidly disconnect the remainder of the circuit from the positive supply when required.

The particular configuration of current mirror is that of a simple current mirror. Other switching circuits for current comparators could be substituted, and specifically different current mirror circuits could be used.

Finally, the circuits disclosed have only a single input terminal. It would be clear to those skilled in the art that, instead of the single NMOS FETS 2 and 4, alternative circuits could be used to selectively connect the nodes 5 and 6 to the reference node VSS.

Figure 3:
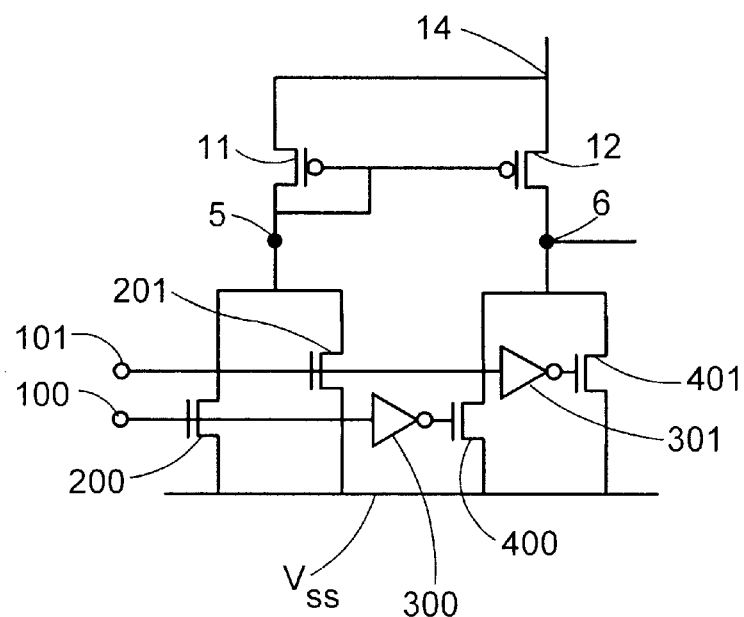
FIG. 3 shows a partial schematic view of an alternative level shifter realizing a first logic function.
Figure 4:
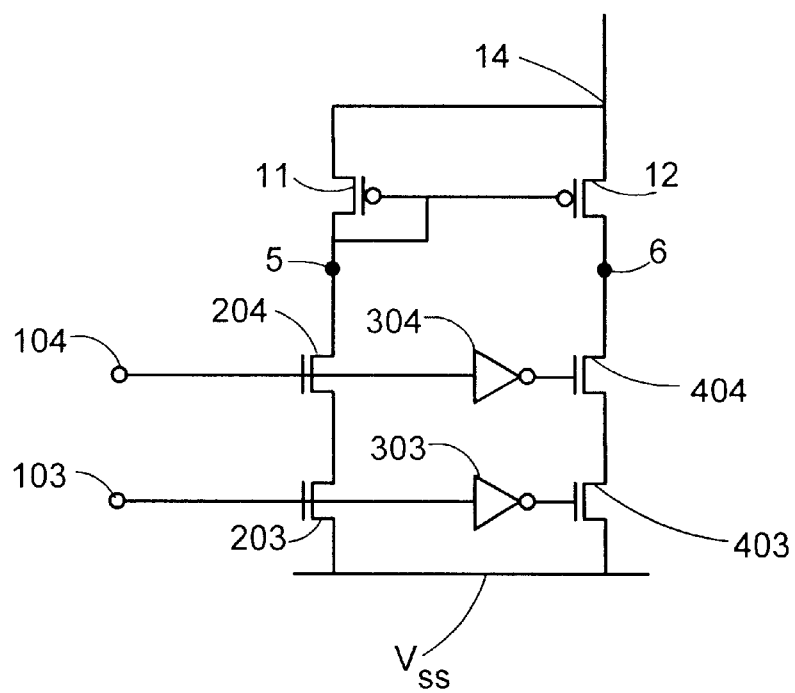
FIG. 4 shows a partial schematic view of a second alternative level shifter realizing a second logic function.

Two examples of such alternative connections are shown in FIGS. 3 and 4.

In FIG. 3 it will be seen that the first FET 2 has been replaced by two parallel FETs 200, 201 and the second FET 4 by two parallel FETs 400, 401. Each of the first pair 200, 201 has its source connected to the reference node VSS and its drain connected to the control node 5 of the current mirror. Similarly, the second pair, 400, 401 each has a source connected to the reference node VSS and a drain connected to the circuit node 6 of the current mirror. The control gate of the first transistor 200 of the first pair is connected to the control gate of the first transistor 400 of the second pair via an inverter 300 and likewise the gate of the second transistor 201 of the first pair is connected to that of the second transistor 401 of the second pair via an inverter 301. The control gate of the first transistor 200 is connected to a first input terminal 100 and that of the second transistor 201 to a second input terminal 101.

It will be clear to those skilled in the art that the circuit of FIG. 3 provides an OR gating function.

A second alternative arrangement is shown in FIG. 4.

In this case each of the first and second FETs 2 and 4 of FIG. 1 are replaced by the series connection of a first pair 203, 204 and a second pair 403, 404 of NMOS FETs with gates interconnected by inverters 303, 304. Respective input terminals 103, 104 are connected to the control gates of the first pair 203, 204. It will be clear to those skilled in the art that this connection provides an AND gating function.

It will be clear to those skilled in the art that other logic gating functions can be achieved by suitable modification of the input transistors.

What is claimed is:

1. A level shifter comprising a current mirror having a circuit node for receiving a current controlled by a control current applied at a control node thereof, said current mirror being selectively connected to a supply terminal via a supply switch, the level shifter further comprising a first switch connected to said control node for selectively applying said control current in response to an input logic signal at an input node, a second switch for selectively pulling down said circuit node in response to said input logic signal, and connecting circuitry connecting said circuit node to a control terminal of said supply switch, the level shifter further comprising a further first switch and a further second switch connected to said first switch and said second switch respectively to realize therewith a logic function.

2. The level shifter of claim 1 wherein said supply switch is implemented in PMOS technology and said first and second switches are NMOS transistors.

3. The level shifter of claim 1, wherein said connecting circuitry includes pull-up circuitry connected to said circuit node for maintaining said circuit node at a high potential after said supply switch disconnects said current mirror from said supply terminal.

4. The level shifter of claim 3, wherein said pull-up circuitry comprises a p FET.

5. The level shifter of claim 1, wherein said connecting circuitry provides a direct electrical connection without any active components between said circuit node and said control terminal of said supply switch.

6. The level shifter of claim 4, wherein said connecting circuitry comprises a first inverter connected between said circuit node and a gate of said p FET and a second inverter connected between said gate of said p FET and said control terminal of said supply switch.

7. The level shifter of claim 1, further comprising an input inverter connected between a control node of said first switch and a control node of said second switch.

8. The level shifter of claim 1, wherein said logic function is an OR logic function.

9. The level shifter of claim 1, wherein said logic function is an AND logic function.

10. A level shifter comprising a current mirror having a circuit node for receiving a current controlled by a control current applied at a control node thereof, said current mirror being selectively connected to a supply terminal via a PMOS supply switch, the level shifter further comprising a first PMOS switch connected to said control node for selectively applying said control current in response to an input logic signal at an input node, a second NMOS switch for selectively pulling down said circuit node in response to said input logic signal, and connecting circuitry connecting said circuit node to a control terminal of said supply switch, wherein said current mirror comprises first and second PMOS transistors having common drain/source terminals, the first PMOS transistor having a source/drain terminal in common with its gate terminal as said control node, and the second PMOS transistor having a gate terminal in common with the gate terminal of the first PMOS transistor and a source/drain terminal as said circuit node, and wherein the level shifter further comprises a further first switch and a further second switch connected to said first switch and said second switch respectively to realize therewith a logic function.

11. The level shifter of claim 10, wherein said connecting circuitry includes pull-up circuitry connected to said circuit node for maintaining said circuit node at a high potential after said supply switch disconnects said current mirror from said supply terminal.

12. The level shifter of claim 11, wherein said pull-up circuitry comprises a p FET.

13. The level shifter of claim 10, wherein said connecting circuitry provides a direct electrical connection without any active components between said circuit node and said control terminal of said supply switch.

14. The level shifter of claim 12, wherein said connecting circuitry comprises a first inverter connected between said circuit node and a gate of said p FET and a second inverter connected between said gate of said p FET and said control terminal of said supply switch.

15. The level shifter of claim 10, further comprising an input inverter connected between a control node of said first switch and a control node of said second switch.

16. The level shifter of claim 10, wherein said logic function is an OR logic function.

17. The level shifter of claim 10, wherein said logic function is an AND logic function.

18. A level shifter comprising a current mirror having a circuit node for receiving a current controlled by a control current applied at a control node thereof, said current mirror being selectively connected to a supply terminal via a supply switch, the level shifter further comprising a first switch connected to said control node for selectively applying said control current in response to an input logic signal at an input node, a second switch for selectively pulling down said circuit node in response to said input logic signal and connecting circuitry connecting said circuit node to a control terminal of said supply switch, wherein said connecting circuitry provides a direct electrical connection without any active components between said circuit node and said control terminal of said supply switch.

19. The level shifter of claim 18, wherein said supply switch is implemented in PMOS technology and said first and second switches are NMOS transistors.

20. The level shifter of claim 18, further comprising an input inverter connected between a control node of said first switch and a control node of said second switch.

21. A level shifter comprising a current mirror having a circuit node for receiving a current controlled by a control current applied at a control node thereof, said current mirror being selectively connected to a supply terminal via a PMOS supply switch, the level shifter further comprising a first NMOS switch connected to said control node for selectively applying said control current in response to an input logic signal at an input node, a second NMOS switch for selectively pulling down said circuit node in response to said input logic signal, and connecting circuitry connecting said circuit node to a control terminal of said supply switch, wherein said current mirror comprises first and second PMOS transistors having common drain/source terminals, the first PMOS transistor having a source/drain terminal in common with its gate terminal as said control node, and the second PMOS transistor having a gate terminal in common with the gate terminal of the first PMOS transistor and a source/drain terminal as said circuit node, and wherein said connecting circuitry provides a direct electrical connection without any active components between said circuit node and said control terminal of said supply switch.

22. The level shifter of claim 21, further comprising an input inverter connected between a control node of said first switch and a control node of said second switch.

\* \* \* \* \*